United States Patent [19]
Menu et al.

[11] Patent Number: 6,078,133
[45] Date of Patent: Jun. 20, 2000

[54] FIELD EMISSION DEVICE HAVING AN AMORPHOUS MULTI-LAYERED STRUCTURE

[75] Inventors: Eric P. Menu, Mesa; John Song, Tempe, both of Ariz.; Bernard F. Coll, Sparta, N.J.

[73] Assignee: Motorola, Inc., Schaumburg, Ill.

[21] Appl. No.: 09/028,797

[22] Filed: Feb. 25, 1998

Related U.S. Application Data

[62] Division of application No. 08/614,703, Mar. 13, 1996, Pat. No. 5,837,331.

[51] Int. Cl.$^7$ ..................................................... H01J 1/02
[52] U.S. Cl. ........................................... 313/310; 313/495
[58] Field of Search ..................... 313/309, 310, 313/403, 409, 411, 441, 491, 495; 427/569, 78, 576, 577

[56] References Cited

U.S. PATENT DOCUMENTS 5,675,216   10/1997   Kumar et al. ........................... 313/495

*Primary Examiner*—Nimeshkumar D. Patel
*Assistant Examiner*—Todd Reed Hopper
*Attorney, Agent, or Firm*—Kathleen Tobin; Kevin D. Wills

[57] ABSTRACT

An amorphous multi-layered structure (100, 200) is formed by a method including the steps of: i) positioning a deposition substrate (101) in a physical vapor deposition apparatus, (300, 400, 500) ii) ionizing a precursor of a multi-phase material within the physical vapor deposition apparatus (300, 400, 500) iv) modulating the total ion impinging energy of the ions to deposit layers having predetermined properties corresponding to the total ion impinging energy values.

5 Claims, 4 Drawing Sheets

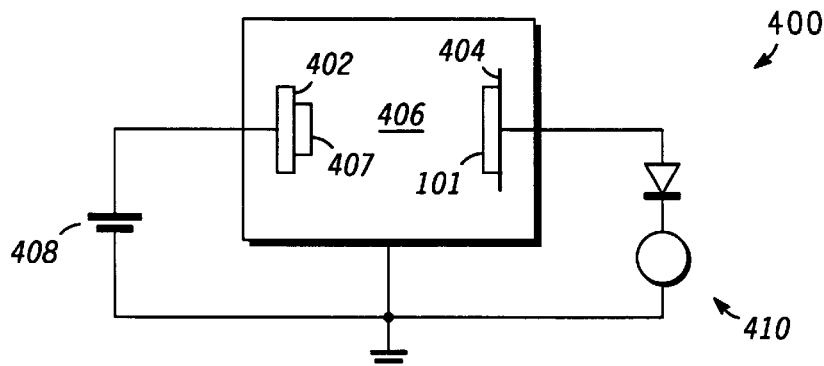
FIG. 7
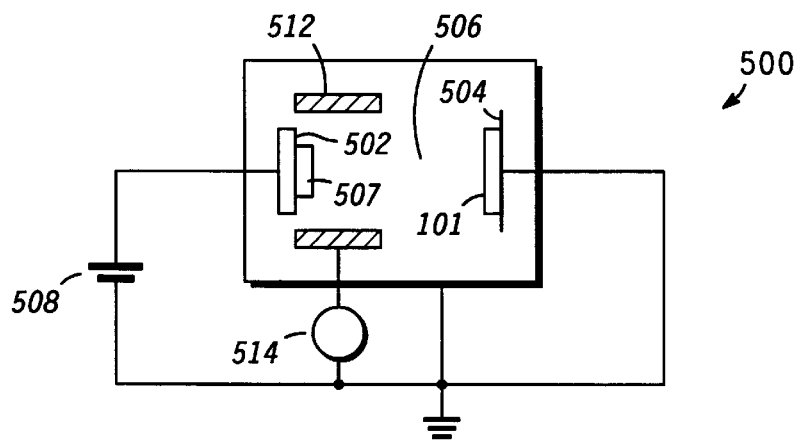
FIG. 8
FIG. 9
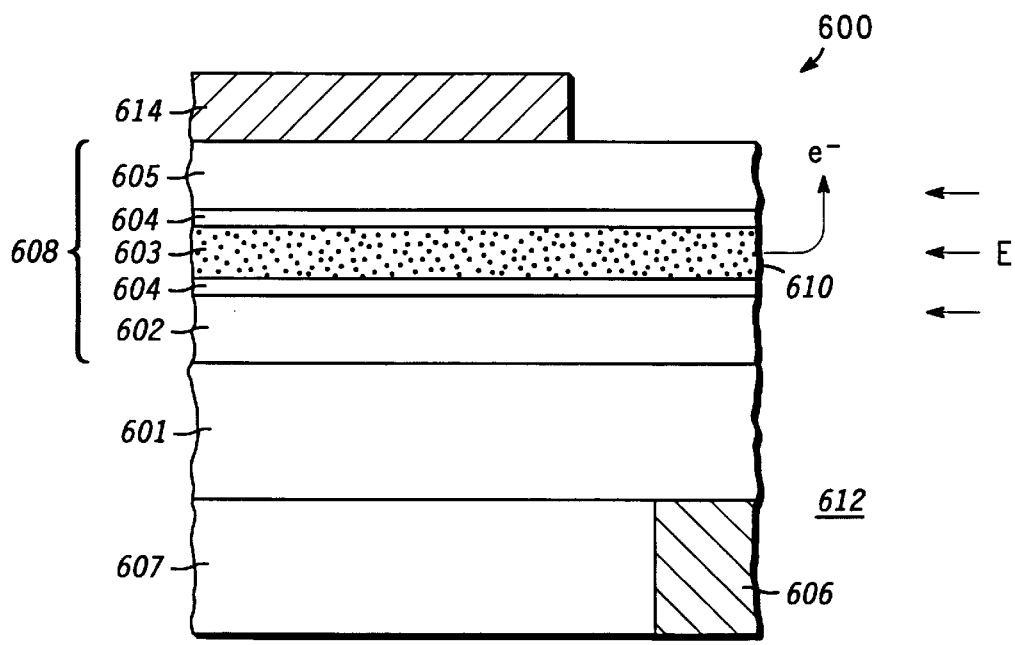

FIELD EMISSION DEVICE HAVING AN AMORPHOUS MULTI-LAYERED STRUCTURE

This application is a divisional of application Ser. No. 08/614,703, filed Mar. 13, 1996 now U.S. Pat. No. 5,837,331.

FIELD OF THE INVENTION

The present invention pertains to the area of amorphous multi-layered structures, and, more specifically, to amorphous carbon multi-layered structures and a method of making amorphous multi-layered structures.

BACKGROUND OF THE INVENTION

Amorphous superlattice structures are known in the art. They are comprised of thin (nanometer range) layers of different semiconductor, metal, or dielectric materials, or mixtures thereof, which exhibit quantum size effects (tunneling, etc.) Prior art superlattice structures have generally been fabricated with silicon-based materials containing hydrogen. These superlattice structures have generally been fabricated with pairs of materials, such as a-Si:H/a-SiN, a-Si:H/a-SiC, and a-Si:H/a-SiO$_x$. Most of the amorphous superlattice structures of the prior art have used band gap modulated structures as opposed to doping modulated structures in order to observe quantum size effects.

Much less is known about the fabrication of amorphous carbon, or 'diamond-like carbon' (DLC), multi-layered superlattice structures. Prior art DLC superlattice structures have a high hydrogen content, the layers of the superstructure being formed from a methane ($CH_4$)-containing plasma in a plasma enhanced chemical vapor deposition (PECVD) system. The presence of hydrogen in the prior art amorphous hydrogenated carbon (a-C:H) films results in stability problems. In a prior art method of forming a-C:H films, the gaseous plasma has a composition of about 8% methane and 92% argon. The prior art PECVD methods of depositing a-C:H films do not offer the ability to easily and precisely control deposition conditions.

Accordingly, there exists a need for an improved method for fabricating DLC superlattice structures which does not introduce stability problems due to hydrogen content and which offers the ability to easily and precisely control deposition conditions.

Deposition conditions determine the nature of the bonds formed as the gaseous species impinge upon the growing solid. The nature and concentrations of the bonds determines the properties of the individual layers and, subsequently, the properties of the amorphous multi-layered structure. For example, amorphous superlattices using a-C:H multi-layers have an optical band gap which can be varied in the range of 1.2 to 4.0 eV by changing the conditions at which the film is deposited. In a prior art method of forming a-C:H films, the lower electrode, or substrate upon which the superlattice is formed, is driven by a 13.5 MHz power supply while an upper electrode is grounded. A sheath space containing the plasma exists between the lower and upper electrodes. A negative, dc, self-bias voltage is thereby obtained across the sheath space. This RF, self bias voltage can be varied by varying the capacitively coupled power for plasma formation. The deposition conditions are controlled by changing the capacitively coupled power for plasma formation. A negative, dc, self-bias voltage in the range of, for example, −70 to −450 V is obtained across the plasma sheath space by varying this capacitively coupled power. However, precise manipulation of the RF, self-induced bias via the capacitively coupled power for plasma formation is difficult, impractical, and costly. A major defect in this process is the difficulty to accurately control the layer thickness growth to less than one atomic layer during the time required for switching the plasma between the different power conditions. The accurate control of the layer thicknesses as well as the abrupt interface between layers are required to generate the quantum size effects.

Accordingly, there exists a need for an improved method for precisely modulating the conditions during the deposition of the constituent layers of an amorphous multi-layered structure.

Amorphous hydrogenated carbon films are being developed and contemplated for use in masking and passivation overlayers, in gate insulators for metal/insulator/semiconductor (MIS) devices for high temperature applications, in memory applications, and for producing reversible memory devices with electrical or optical information writing and electrical or photoelectrical reading. It has also been recognized that the electrophysical parameters of the a-C:H films can be varied by varying the composition and dimensions of the constituent layers.

Field emission devices (FEDs) are known in the art. Also known is the incorporation of low-work function materials, including DLC, in FEDs to exploit their appreciable electron emissiveness at low voltages. An FED includes a plurality of layers which provide the appropriate electrical conditions for controlled electron emission. These layers have varying electrical properties. Prior art methods of forming, in a field emission device, layers having the required electrical properties include the provision of a variety of chemical species, requiring distinct deposition steps, each of which can require unique deposition conditions and/or equipment.

Accordingly, there exists a need for a method of making a field emission device wherein the constituent layers are fabricated in a continuous manner thereby obviating the need for time-consuming, multiple-step processes.

BRIEF DESCRIPTION OF THE DRAWINGS

Referring to the drawings:

FIGS. 6–8 are schematic representations of physical vapor deposition apparati suitable for performing various steps in a method in accordance with the present invention;

FIG. 9 is a cross-sectional view of a field emission device which is realized by performing various steps of another embodiment of a method in accordance with the present invention;

DESCRIPTION OF THE PREFERRED EMBODIMENTS

Figure 1:
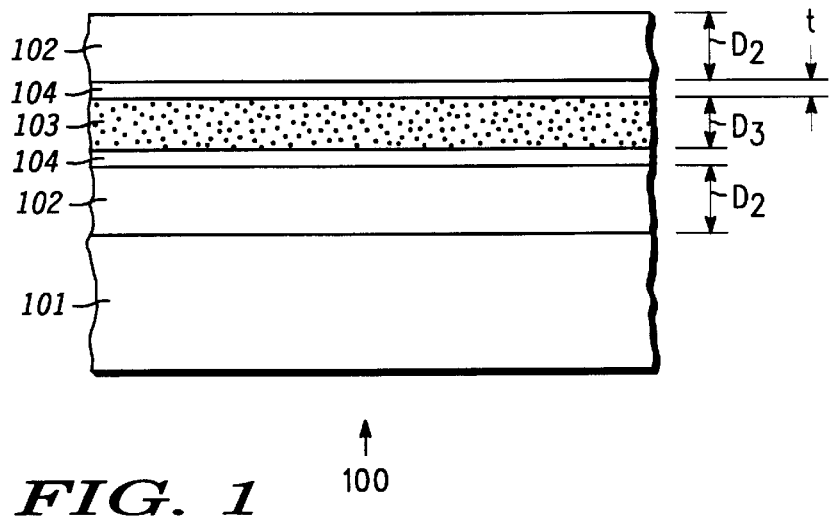
FIG. 1 is a cross-sectional view of a structure which is realized by performing various steps of a method in accordance with the present invention.

Referring now to FIG. 1 there is depicted a cross-elevational view of an amorphous multi-layered structure 100, which is realized by performing various steps of a method in accordance with the present invention. Amorphous multi-layered structure 100 includes a deposition substrate 101, a pair of first-phase layers 102, and a second-phase layer 103. Deposition substrate 101 is made from glass or silicon. In this particular embodiment, pair of first-phase layers 102 have the same physical, electrical, and chemical properties, while second-phase layer 103 has physical, electrical, and/or chemical properties which are distinct from those of first-phase layers 102. In other embodiments of a method in accordance with the present invention, multi-layer structures are realized in which each of the constituent layers has a distinct set of properties; alternatively, other structures can be realized which include many layers having alternating properties so that the structures have a periodicity which can be modulated. Located between each first-phase layer 102 and second-phase layer 103 is a transition layer 104. First-phase layers 102 have equal thicknesses, $D_2$, which are distinct from the thickness, $D_3$, of second-phase layer 103. In general, in order to exhibit quantum size effects (quantum wells, coupled quantum wells, superlattices, tunneling, etc.), thicknesses $D_2$ and $D_3$ are within the range of 0–100 angstroms, and the thickness, t, of transition layer 104 is less than one atomic layer. In accordance with the method of the present invention, first-phase layers 102 and second-phase layer 103 are made from a precursor of a multi-phase material. That is, the original material is the same. A multi-phase material is a solid material which can exist in different phases or micro structures, the relative compositions of which determine the properties of a given structure comprised of the multi-phase material. To aid understanding, and as will be described in greater detail below, the distinctive properties of first-phase layers 102 and second-phase layer 103 are attributable to the difference in the energy of the formative ions as they impinge upon the growing solid layer. This impinging energy of the ions is a significant factor in determining the types, and relative amounts, of chemical bonds formed during the deposition of first-phase layers 102 and second-phase layer 103. In accordance with the method of the present invention the precursor of a multi-phase material includes any material, such as graphite, which can be vaporized, or converted, to a gaseous plasma including a plurality of plasma ions which are then depositable upon deposition substrate 101 in any of a number of physical deposition methods known in the art, such as arc deposition, laser ablation, ion beam implantation, ion beam evaporation, and sputtering. The precursor of a multiphase material is one which can be ionized and deposited by at least one of the above methods to form layers having distinct phases and/or layers having varying relative compositions of the distinct phases. The deposited structures are amorphous, which includes structures having no long-range order and composite structures that have inclusions of nano-sized clusters disposed within a matrix having no long-range order. For example, in a method for forming an amorphous multi-layered structure in accordance with the present invention the precursor of a multi-phased material is graphite, which is vaporized to form carbon ions. When deposited on deposition substrate 101, the carbon ions impinge upon the solid to form a solid layer having relative compositions of $sp^3$-bonded carbon atoms and $sp^2$-bonded carbon atoms. The relative compositions of $sp^3$-bonded carbon atoms and $sp^2$bonded carbon atoms are determinative of certain properties of the solid, amorphous carbon layer. These properties include resistivity, electronic emission, band gap, density, hardness, and stress. For example, a layer of carbon having a high relative composition of $sp^2$-bonded carbon atoms has a low resistivity, whereas a layer of carbon having a high relative composition of $sp^3$-bonded carbon atoms has a high resistivity. If a certain property value is desired for a given layer, such as the value of the band gap, and if the relationship between relative composition, or %$sp^3$, and this particular property is known, the relative composition can be specified. Then, if the relationship between the relative composition and total ion impinging energy, E, is known, an total ion impinging energy can be specified to realize the desired value of the given property. A similar process for specifying the total ion impinging energy, the significance of which will be described in greater detail below, can be performed for any material, such as boron nitride (BN) and aluminum oxide ($Al_2O_3$), which can exist in multiple phases. Boron nitride, for example, exhibits both hexagonal and cubic micro structures, the relative compositions of which can be varied with total ion impinging energy during physical deposition. The precursor of the boron nitride multiphase material includes a mixture of borane gas/vapor and nitrogen gas.

Figure 2:
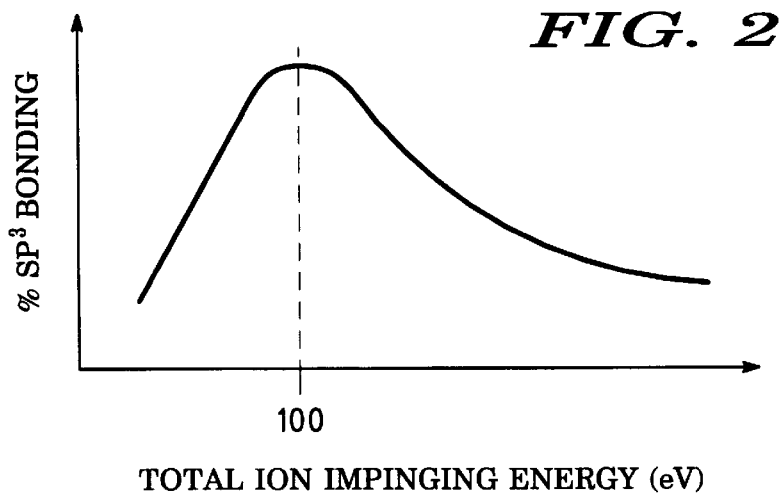
FIG. 2 is a graphical depiction of per cent sp$^3$-bonding in a deposited carbon layer as a function of total ion impinging energy.

Referring now to FIG. 2, there is shown a graphical depiction of per cent $sp^3$-bonding in a deposited carbon layer as a function of total ion impinging energy. It has been demonstrated that the properties of amorphous-carbon films depend significantly on the fraction of $sp^3$-bonding. Additionally, as illustrated in FIG. 2, it is known that the per cent $sp^3$-bonding is a predictable, and sensitive, function of total ion impinging energy. The maximum per cent $sp^3$-bonding has been observed to occur at incident ion energies in the range of 30–150 eV. A high per cent $sp^3$-bonding corresponds to a high degree of diamond-like character of the amorphous carbon layer. Diamond-like carbon (DLC) materials are known to have, for example, low work functions and, therefore, are utilized in electron-emitting structures of electron emission devices, such as field emission devices. The data of FIG. 2 is utilized, in accordance with the method of the present invention, to accurately, and precisely, control and optimize the properties of amorphous multi-layered structure 100: a layer's property value is set, the corresponding per cent $sp^3$-bonding is determined, and the corresponding total ion impinging energy specified.

Total ion impinging energy, E, is given by the following equation:

$$E = E_i + e[z](V_p + |U_s|)$$

where $E_i$ is the residual of the original directed energy that the ions retain after traveling from the location of the precursor of the multi-phase material to deposition substrate 101; e is a constant equaling the elementary charge; z is the average number of elementary charge per ion; $V_p$ is the plasma potential; and $|U_s|$ is the absolute value of the bias voltage applied to deposition substrate 101. In the case of carbon ions, which exist as $C^{2+}$ and $C^+$ ions, the applied bias voltage, $U_s$, is negative in order to accelerate the positive carbon atoms toward deposition substrate 101. For a vacuum arc deposition method, at a first approximation, $E_i$ and $V_p$ can be assumed to be independent of the filtering magnetic field strength, and the total ion impinging energy is, thus, proportional to the voltage bias applied to deposition substrate 101. For the deposition of amorphous carbon films, a typical value of $E_i$ is 20 eV; a typical value of $V_p$ is −15 V; and z is equal to 1.01 because the ratio $C^{2+}$:$C^+$ is 1:99. In the preferred embodiment of a method for forming an amorphous multi-layered structure, the total ion impinging energy, is modulated in a predetermined manner with respect to time by modulating the voltage bias applied to deposition substrate 101.

Figure 3:
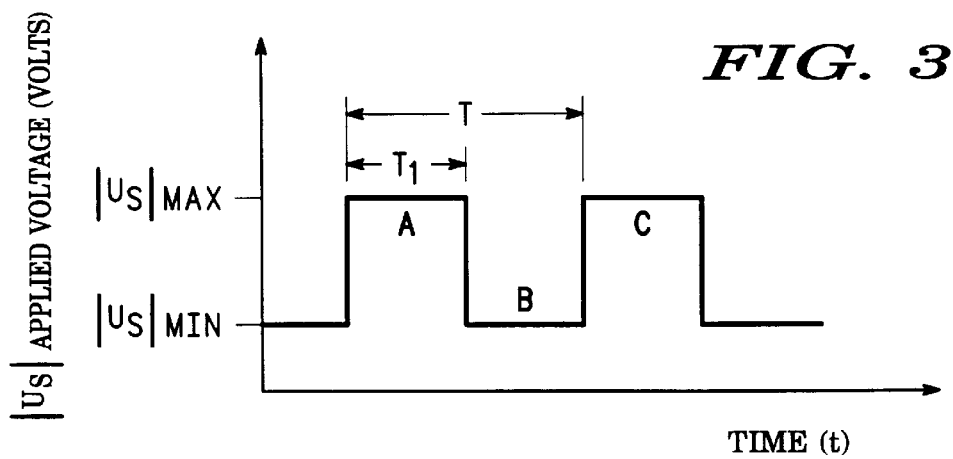
FIG. 3 is a graphical depiction of the step of modulating an applied voltage applied to a deposition substrate in accordance with an embodiment of a method for forming an amorphous multi-layered structure in accordance with the present invention.

Referring now to FIG. 3, there is shown a graphical depiction of the step of modulating applied bias voltage, $|U_s|$, in accordance with an embodiment of a method for forming an amorphous multi-layered structure in accordance with the present invention. The functionality depicted in FIG. 3 is a step function wherein the maximum value of the applied bias voltage, $|U_s|_{max}$, has a value in the range of 0–1500 volts and wherein the minimum value of the applied bias voltage, $|U_s|_{min}$, has a value in the range of 0–1000 volts. The particular modulation pattern depicted in FIG. 3 is utilized to form amorphous multi-layered structure 100 of FIG. 1. The portion of the graph labeled A represents the applied voltage during the formation of first-phase layer 102 which is formed on deposition substrate 101. In this particular embodiment, during the A-labeled portion of the graph, $|U_s|_{max}$ has a value corresponding to the low %sp³ range in the graph of FIG. 2. The duration of $|U_s|_{max}$, $T_1$, in part A is determinative of the thickness of first-phase layer 102 which is formed on deposition substrate 101. The value of $T_1$ is in the range of 10 micro-seconds to 10 seconds. Then, the applied bias voltage is switched from $|U_s|_{max}$ to $|U_s|_{min}$, as depicted by the portion of the graph of FIG. 3 which is labeled "B". During this voltage switch, transition layer 104 is formed which is closest to deposition substrate 101, as shown in FIG. 1. The response time of the deposition system to a change in applied bias voltage is fast enough so that the thickness, t, of transition layer 104 is less than one atomic layer. The value of $|U_s|_{min}$ is determinative of the properties of second-phase layer 103; the duration of the B-labeled portion of the graph determines the thickness, $D_2$, of second-phase layer 103. Then, the applied bias voltage is switched from $|U_s|_{min}$ to $|U_s|_{max}$. During this second voltage switch, transition layer 104 is formed which is furthest from deposition substrate 101 in FIG. 1. The duration of the C-labeled portion of the graph is also equal to $T_1$ so that the thicknesses of first-phase layers 102 are equal. In other embodiments of a method in accordance with the present invention, amorphous multi-layered structures, having predetermined properties which correspond to values of the total ion impinging energy, are realized. For example, in another embodiment of a method in accordance with the present invention, a plurality of alternating layers are formed on deposition substrate 101 by modulating the applied bias voltage so that a cycle, such as the one represented by the A- and B- labeled portions of the graph in FIG. 3 having a period T, is repeated at a frequency in the range of 0–100 Khz until a predetermined number of layers, or a predetermined film thickness, is realized. In this particular embodiment, it is useful to define a duty cycle, D, which is the ratio of $T_1$ to the cycle period, T. The duty cycle has a value in the range of 10 to 100%. The parameters $T_1$ and D are utilized to control the individual layer thicknesses and to modulate the periodicity of the multi-layered structure.

Figure 4:
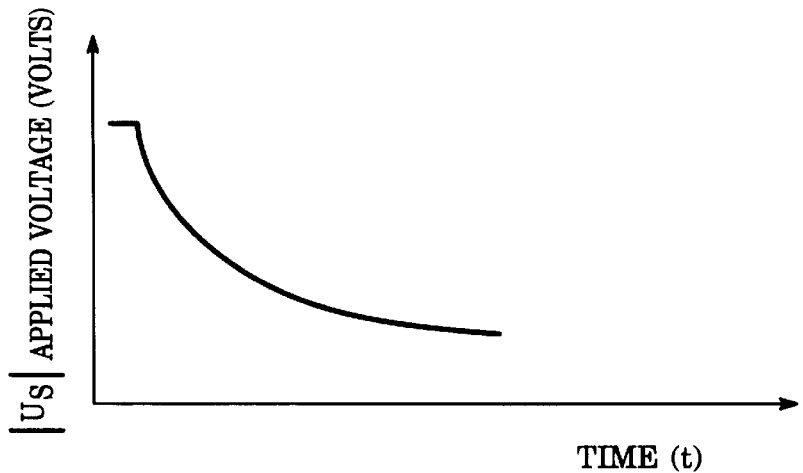
FIG. 4 is a graphical depiction of the step of modulating an applied voltage applied to a deposition substrate in accordance with another embodiment of a method for forming an amorphous multi-layered structure in accordance with the present invention.
Figure 5:
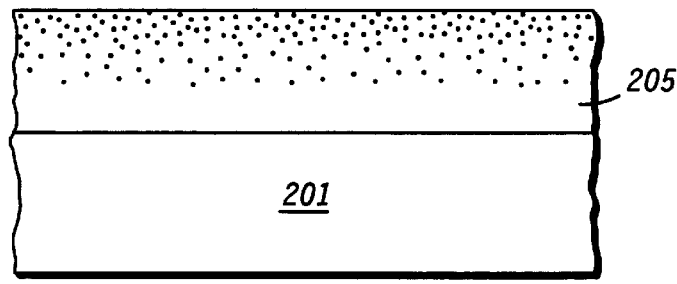
FIG. 5 is a cross-sectional view of a structure which is realized by performing various steps of an embodiment (characterized in FIG. 4) of a method in accordance with the present invention.

Referring now to FIGS. 4 and 5, there are shown a graphical depiction (FIG. 4) of the step of modulating an applied voltage applied to a deposition substrate 201 (FIG. 5) in accordance with another embodiment of a method for forming an amorphous multi-layered structure 200 in accordance with the present invention. In this particular embodiment, the bias voltage applied to deposition substrate 201 is graded so that it varies smoothly and continuously with respect to time so that a layer 205 having graded properties is formed. In this particular embodiment layer 205 is an amorphous carbon film, and the precursor of the multi-phase material is graphite. The applied voltage initially has a high value corresponding to a low %sp³. In this particular embodiment, the applied voltage is then decreased so that it has a parabolic functionality with respect to time, as illustrate in FIG. 4. The structure that is realized is shown in FIG. 5 which illustrates the gradient of %sp³ over the thickness of layer 205, the lowest relative sp³ composition existing at the edge of layer 205 next to deposition substrate 201, the highest relative sp³ composition existing at an outer surface 207 of layer 205. It will occur to one skilled in the art to provide a bias voltage having other functionalities with respect to time so that the desired film properties are realized.

Figure 6:
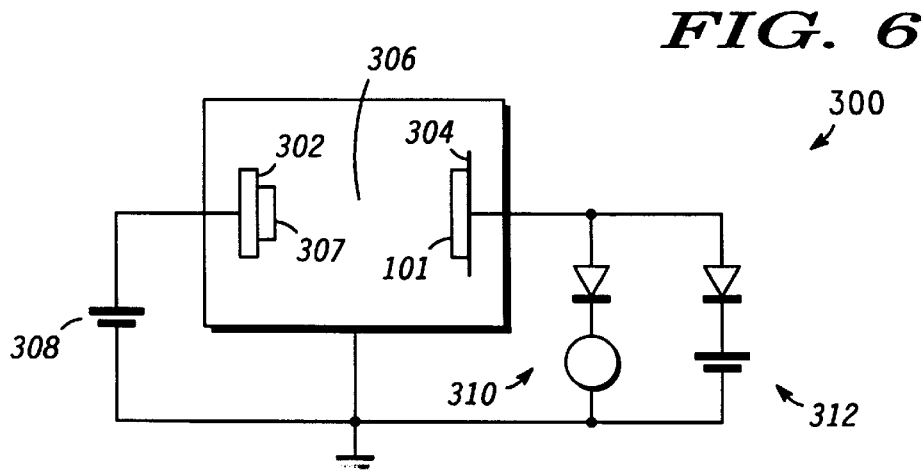

Referring now to FIG. 6, there is shown a representative schematical depiction of an embodiment of a physical vapor deposition apparatus 300 suitable for executing the various steps of the preferred embodiment of a method for forming an amorphous multi-layered structure in accordance with the present invention. Physical vapor deposition apparatus 300 includes a substrate holding fixture 304 designed to hold deposition substrate 101, an evacuated enclosure 306, and an ion-source fixture 302 designed to contain a precursor 307 of a multiphase material. Physical vapor deposition apparatus 300 may be a closed system, or it may be adapted to provide a feed flow of precursor 307. A direct-current (DC) power supply 312 is operably coupled to deposition substrate 101 so that a DC bias voltage can be applied to deposition substrate 101. A pulsed power supply 310 is also operably coupled to deposition substrate 101 so that a pulsed voltage can be applied to deposition substrate 101. In this particular embodiment, ion-source fixture 302 includes an arc evaporation source operably coupled to a DC arc power supply 308 for vaporizing and ionizing precursor 307 in order to form a plasma within evacuated enclosure 306. The plasma has a plurality of plasma ions which are then accelerated toward deposition substrate 101. In the preferred embodiment precursor 307 includes graphite, so that the plasma ions are positively charged carbon ions. Thus, the accelerating potential applied to deposition substrate must be negative. As described above with reference to FIG. 1, the type and relative composition of the bonds formed, as the carbon cations impinge on the growing solid, depend upon the total ion impinging energy, which is the total energy of the ion flux just before striking the surface of the solid. Because the properties of the solid layer and the entire amorphous multi-layered structure depend on the type and relative composition of the chemical bonds formed, the properties of the solid layer depend upon the total ion impinging energy. The amorphous multi-layered structure is comprised of a plurality of solid layers having distinct properties which are formed by modulating the total ion impinging energy by a method in accordance with the present invention. As described with reference to FIG. 2, the total ion impinging energy is a function of z (the average number of elementary charge per ion) and $|U_s|$ (the absolute value of the bias voltage applied to deposition substrate 101). The variables $E_i$ (the residual of the original directed energy) and $V_p$ (the plasma potential) can, to a first approximation, be treated as constants for the systems considered herein. The physical deposition apparati 300, 400 of FIGS. 6 and 7 are designed to exploit the dependence upon $|U_s|$ (the absolute value of the bias voltage applied to deposition substrate 101) of the total ion impinging energy. Referring once again to FIG. 6, physical vapor deposition apparatus 300 provides the modulation of the applied bias voltage depicted in FIG. 3. In this particular embodiment, direct-current power supply 312 provides a constant bias voltage signal having an absolute value equal to $|U_s|_{min}$. Direct-current power supply 312 and pulsed power supply 310 are electronically coupled to substrate 101 by, for example, providing a thin electrode layer on substrate 101. The electrode layer may be made of titanium tungsten or aluminum or some other suitable material. Pulsed power supply 310 provides voltage pulses which are superimposed upon the constant bias voltage provided by direct-current power supply 312. The amplitude of the pulsed voltage is modulated by providing a periodic step change in the amplitude pulsed voltage. In other embodiments of a method in accordance with the present invention, the amplitude of the pulsed voltage is modulated by providing a graded change in the amplitude of the pulsed voltage, thereby providing a layer of multi-phased material having graded chemical properties. During those times that a voltage pulse is being superimposed by pulsed power supply 310, the absolute value of the voltage applied to deposition substrate 101 is equal to $|U_s|_{max}$. The selection of the values of $|U_s|_{min}$ and $|U_s|_{max}$ determine the $sp^3/sp^2$ bond ratio in the amorphous carbon layers comprising the resulting amorphous carbon multi-layered structure. The pulse duration corresponds to the time $T_1$ which determines the layer thickness. The pulse frequency is, as described above with reference to FIG. 3, within the range of 0–100 Khz. Multi-layered structures can be made by having alternatively rich $sp^3/sp^2$ amorphous carbon layers, the compositions of which are determined by the values of $|U_s|_{min}$ and $|U_s|_{max}$ and the thicknesses of which are determined by pulse duration and cycle period, T. Referring once again to FIGS. 1 and 3, the A-labeled, B-labeled, and C-labeled portions of the graph of FIG. 3 depict the applied voltages during the formation of lower first-phase layer 102, second-phase layer 103, and upper first-phase layer 102, respectively. Given that the deposition rate is D angstroms/second for this process, the thickness, $D_2$, of first-phase layers 102 is given by:

$$D_2=D*T_1)$$

where $T_1$ is in seconds, and the thickness, $D_1$, of second-phase layer 103 is given by:

$$D_1=D*(T-T_1)$$

where T is in seconds. In amorphous multi-layered structure 100 (FIG. 1), first-phase layers 102 include layers of amorphous carbon which are rich in $sp^2$ bonds, and second-phase layer 103 includes a layer of amorphous carbon which is rich in $sp^3$ bonds. Correspondingly, the value of $|U_s|_{max}$ is large enough to provide and total ion impinging energy falling within the "tail" end of the graph of FIG. 2, in the region of low $\%sp^3$ bonding, and the value of $|U_s|_{min}$ is small enough to provide an total ion impinging energy falling within the "peak" region (about 100 eV) of the graph of FIG. 2, in the region of maximum $\%sp^3$ bonding. The response time of the total ion impinging energy to the modulations in the voltage applied to deposition substrate 101 are fast, so that transition layers 104 have thicknesses, t, which are less than one atomic layer. The chemical compositions of transition layers 104 are not the same due to the different deposition conditions at the time the voltage step changes are made. It will be appreciated that amorphous multi-layered structures which are formed by a method in accordance with the present invention are deposited in a continuous manner, obviating the need to provide distinct starting materials and distinct pieces of equipment. Additionally, amorphous multi-layered structures including a single chemical element, such as carbon, can be formed by other embodiments of a method in accordance with the present invention.

Referring now to FIG. 7, there is shown a representative schematical depiction of an embodiment of a physical vapor deposition apparatus 400 suitable for executing the various steps of another embodiment of a method for forming an amorphous multi-layered structure in accordance with the present invention. In this particular embodiment, a DC power supply is not operably coupled to deposition substrate 101. All other elements of physical vapor deposition apparatus 400 are the same as those of apparatus 300 (FIG.6) and are similarly referenced with numbers starting with the number "4". Thus, a pulsed power supply 410 is operably coupled to deposition substrate 101 so that a pulsed voltage can be applied to deposition substrate 101. In a manner similar to that described with reference to FIG. 6, the pulsed voltage supplied by pulsed power supply 410 is modulated in a predetermined manner with respect to time, such as a step function or graded function, to provide the predetermined physical, chemical, and electrical properties of the constituent layers and of the entire amorphous multi-layered structure. For example, when the pulsed voltage signal includes a step function, such as that depicted in FIG. 3, the value of $|U_s|_{max}$ is equal to the magnitude of the pulsed voltage signal when it is on, and the value of $|U_s|_{min}$ is equal to the low voltage alternance of pulsed power supply 410, which is a negligible applied voltage. Thus, during the "off" periods of pulsed power supply 410, the total ion impinging energy is controlled by $E_i$, the residual energy of the carbon ions, which, for a typical carbon vacuum arc deposition process is in the range of 20–30 eV, which is sufficient to yield the growth of layers with a rich $sp^3$ content. The $sp^2$-rich layers of the modulated structure are produced during the application of the voltage from pulsed power supply 410.

Referring now to FIG. 8, there is shown a representative schematical depiction of an embodiment of a physical vapor deposition apparatus 500 suitable for executing the various steps of another embodiment of a method for forming an amorphous multi-layered structure in accordance with the present invention. Physical vapor deposition apparatus 500 includes all but one of the elements of physical vapor deposition apparatus 400 of FIG. 7, which references are similarly referenced by numbers starting with a "5", and further includes a rectilinear magnetic apparatus 512. Rectilinear magnetic apparatus 512 is located between an ion-source fixture 502 and a substrate holding fixture 504 so that rectilinear magnetic apparatus 512 surrounds the ion plasma within an evacuated enclosure 506. Rectilinear magnetic apparatus 512 is operably coupled to a magnetic coil pulsed power supply 514. In this particular embodiment of a method for forming an amorphous multi-layered structure, a controllable magnetic field is provided between ion-source fixture 502 and substrate holding fixture 504. The magnetic field strength of the controllable magnetic field is modulated to provide the desired modulation of total ion impinging energy to make the desired amorphous multi-layered structure. In another embodiment the magnetic field is provided by the magnetic coil of a filtered arc source. In this particular embodiment of a method in accordance with the present invention, the total ion impinging energy is modulated by changing the directed energy of the carbon ions during their transport to deposition substrate 101. Modulations in the magnetic field strength provide modulations in the acceleration of the cations and, consequently, modulations in total ion impinging energy so that multi-layered amorphous structures are formed on deposition substrate 101.

Referring now to FIG. 9, there is depicted a cross-sectional view of a field emission device 600, portions of which are realized by performing various steps of another embodiment of a method in accordance with the present invention. Field emission device 600 includes a substrate 607, a conductive row 606 disposed on substrate 607, and a non-conducting amorphous carbon layer 601 disposed on both substrate 607 and conductive row 606. Field emission device 600 further includes a ballasted emission structure 608 which includes a ballast resistor layer 602, an electron emitter layer 603 having an electron emission edge 610, and an emission-control layer 605. Field emission device 600 also includes a conductive column 614 which includes a metal layer formed on emission-control layer 605. Conductive column 614 has a recessed edge which is positioned a distance from the edge of ballasted emission structure 608. A transition layer 604 exists between ballast resistor layer 602 and electron emitter layer 603, and between electron emitter layer 603 and emission-control layer 605. Substrate 607 includes a layer glass or silicon having a major surface, and may further include an adhesion layer being formed on the major surface, such as a thin layer of a dielectric. Conductive row 606 is a patterned conductor comprising one of the electrodes which provide an electric field for electron field emission. Methods for forming conductive row 606 and conductive column 614 are known in the art. Non-conducting amorphous carbon layer 601 and ballasted emission structure 608 are realized by performing various steps of a method in accordance with the present invention. Non-conducting amorphous carbon layer 601 includes a layer of non-conducting carbon which has a high percentage sp$^3$ bonding so that non-conducting amorphous carbon layer 601 electrically isolates conductive row 606 from ballasted emission structure 608. The properties of ballasted emission structure 608 are specified so that electrons are emitted from electron emission edge 610 and so that these electrons exhibit an upward trajectory, as indicated by a curved arrow in FIG. 9. The electrons may be directed, for example, toward an anode (not shown) of a field emission display, which is designed to receive electrons to emit light at, for example, a phosphor coating disposed on the anode. The electric field is provided by operably coupling conductive row 606 and conductive column 614 to voltage sources (not shown) providing predetermined voltages. The electric field, represented by straight arrows in FIG. 9, is shaped so that emitted electron do not travel to conductive row 606 which would result in an undesired leakage current. In this specific embodiment of a method in accordance with the present invention, the specific resistivities and work functions of ballast resistor layer 602, electron emitter layer 603, and emission-control layer 605 are controlled to provide the above emission characteristics. Non-conducting amorphous carbon layer 601 and ballasted emission structure 608 are formed during one continuous run, thereby providing enhanced processing time and lower cost. The edges of ballast resistor layer 602 and emission-control layer 605 are non-emissive (not emitting an electrical current greater than 1 picoamp) when exposed to an electric field having an electric field strength less than about 200 volts/micrometer.

The resistivities of ballast resistor layer 602 and emission-control layer 605 are specified so that a uniform voltage is provided to all potential emission points along electron emission edge 610 thereby achieving uniform emission and preventing runaway conditions wherein all the current originates from one point. Ballast resistor layer 602 and emission-control layer 605 are also grown so that they shape the electric field so that the electric field lines are perpendicular to electron emission edge 610. This forces the initial electron trajectories to be parallel to the electric field lines away from conductive row 606. Thus, ballast resistor layer 602 and emission-control layer 605 both serve the dual functions of providing ballasting resistance and shaping the electric field. Finally, ballast resistor layer 602 and emission-control layer 605 each has a thickness within the range of 10 angstroms to 10 micrometers. Electron emitter layer 603 has optimized electron emission properties so that a predetermined current value is achieved at a low value of electric field strength. The resistivity of electron emitter layer 603 is chosen so that a short does not form between ballast resistor layer 602 and emission-control layer 605. Electron emission edge 610 is emissive when exposed to an electric field having an electric field strength less than about 150 volts/micrometer. It is believed that the corresponding work function of electron emitter layer 603 is less than about 1 eV. The resistivity and electron emissiveness of amorphous carbon structures are functions of the relative composition of sp$^3$ chemical bonding, which can be controlled via the total ion impinging energy of the carbon ions during physical vapor deposition of the structures, in accordance with the present invention. In this particular embodiment of a method in accordance with the present invention, first the functionality between %sp$^3$ bonding of amorphous carbon (the multi-phase material) and resistivity is determined. Also, the functionality between %sp$^3$ bonding of amorphous carbon and electron emissiveness and/or work function is determined. From these relationships, the values of %sp$^3$ bonding are specified for non-conducting amorphous carbon layer 601, ballast resistor layer 602, electron emitter layer 603, and emission-control layer 605 to provide the predetermined values for resistivity and electron emissiveness and/or work function, as described above. The relationship depicted in FIG. 2 is utilized to determine the necessary values of total ion impinging energy to provide the values of %sp$^3$ bonding thus specified. Utilizing the equation for total ion impinging energy described with reference to FIG. 2, the value of the appropriate process variable is specified, as described with reference to FIGS. 6, 7, and 8. The appropriate process variable is the one which is being utilized to modulate total ion impinging energy. In this particular embodiment, the substrate 607/conductive row 606 structure is place in physical vapor deposition chamber 306 of physical vapor deposition apparatus 300 so that deposition occurs a surface of the substrate 607/conductive row 606 structure. Also, graphite is provided within physical vapor deposition chamber 300 at ion-source fixture 302. The graphite is ionized to form within evacuated enclosure 306 a gaseous plasma having a plurality of carbon cations. The vacuum arc method for ionizing graphite provides an ionicity, or ratio of the number of ions to neutral particles within a plasma, of about 90–99%, which is desirable because only charged species can be accelerated toward the substrate 607/conductive row 606 structure. In a manner similar to that described with reference to FIGS. 6 and 3, a pulsed power supply is operably coupled to the substrate 607/conductive row 606 structure so that a pulsed voltage can be applied to the substrate 607/conductive row 606 structure. A first pulsed voltage is applied to provide a first total ion impinging energy thereby forming on the substrate 607/conductive row 606 structure a first layer of hydrogen-free amorphous carbon having the properties of a dielectric thereby forming non-conducting amorphous carbon layer 601. When the predetermined thickness of non-conducting amorphous carbon layer 601 (within the range of 10 angstroms to 3 micrometers) is achieved, a second pulsed voltage is applied to provide a second total ion impinging energy thereby forming on non-conducting amorphous carbon layer 601 a second layer of hydrogen-free amorphous carbon having the predetermined set of properties as described above, including non-emissiveness when exposed to an electric field strength of less than about 200 volts/micrometer, to form ballast resistor layer 602. Ballast resistor layer 602 is deposited to a thickness in the range of 10 angstroms to 10 micrometer. Thereafter, a third pulsed voltage is applied to provide a third total ion impinging energy thereby forming on ballast resistor layer 602 a third layer of hydrogen-free amorphous carbon having the predetermined set of properties as described above, including electron emissiveness at electron emission edge 610 when electron emission edge 610 is exposed to electric field strengths less than about 150 volts/micrometer, to form electron emitter layer 603. Electron emitter layer 603 is deposited to a thickness in the range of 10 angstroms to 1 micrometer. Thereafter, a fourth pulsed voltage is applied to provide a fourth total ion impinging energy thereby forming on electron emitter layer 603 a fourth layer of hydrogen-free amorphous carbon having the predetermined set of properties as described above, including non-emissiveness when exposed to an electric field strength of less than about 200 volts/micrometer, to form emission-control layer 605. Emission-control layer 605 is deposited to a thickness in the range of 10 angstroms to 10 micrometers. Then, an aperture is formed through non-conducting amorphous carbon layer 601, ballast resistor layer 602, electron emitter layer 603, and emission-control layer 605 thereby forming an emitter well 612 and exposing an emission structure, which, in this particular embodiment, includes an edge of electron emitter layer 603 disposed within emitter well 612 to define electron emission edge 610. If it is determined that the properties of ballast resistor layer 602 and emission-control layer 605 are the same, the second pulsed voltage and the fourth pulsed voltage have the same amplitude and duration. In other embodiments of the method of the present invention, the first, second, third, and/or fourth pulsed voltages may include multi-step voltage signals or graded voltage signals, as described with reference to FIGS. 3–5, to realize structures having the predetermined emissive and resistive properties. For example, electron emitter layer 603 can include a superlattice having a plurality of carbon layers thin enough so that electron emitter layer 603 exhibits quantum size effects. These quantum size effects can be exploited to provide enhanced electron emission properties and control. In this manner, non-conducting amorphous carbon layer 601, ballast resistor layer 602, electron emitter layer 603, and/or emission-control layer 605 may include a multi-layered structure or a structure having graded properties.

Figure 10:
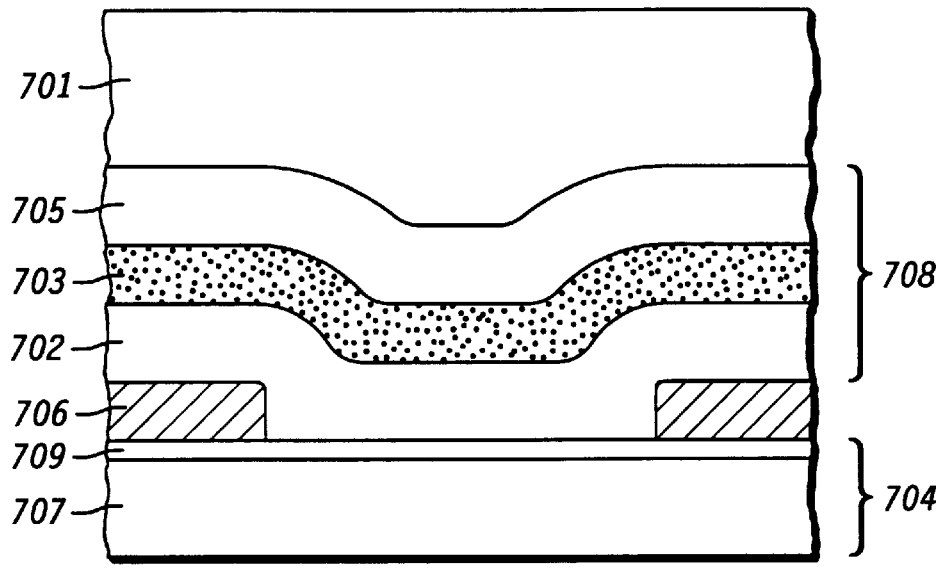
FIG. 10 is a cross-sectional view of a structure which is realized by performing various steps of another embodiment of method in accordance with the present invention.

Referring now to FIG. 10 there is depicted a cross-sectional view of a structure 700, portions of which are realized by performing various steps of another embodiment of a method in accordance with the present invention. Structure 700 includes a substrate 704 including a layer 707 of glass or silicon and a dielectric layer 709 disposed on layer 707. A conductive row 706 is formed on dielectric layer 709. Structure 700 further includes a ballasted emission structure 708, which includes a ballast resistor layer 702, an electron emitter layer 703, and an emission-control layer 705. Structure 700 also includes a non-conducting amorphous carbon layer 701 of amorphous carbon which is formed on emission-control layer 705. Dielectric layer 709 is an adhesion layer. In other embodiments, an adhesion layer is not required. The deposition steps of the method for forming structure 700, and the properties of the resulting structures, are similar those corresponding to field emission device 600 (FIG. 9); structures in FIG. 10, which are similar to those of FIG. 9, have the same reference number starting, however, with a "7". In the method for forming structure 700, the step of depositing non-conducting amorphous carbon layer 701 occurs after the step of depositing ballasted emission structure 708. In other embodiments of a method according to the present invention utilized to form a field emission device, the ballasted emission structure is made from a multi-phase material other than carbon and/or may include a single layer of the multi-phase material having uniform properties, wherein the multi-phase material exhibits its self-ballasting properties.

Figure 11:
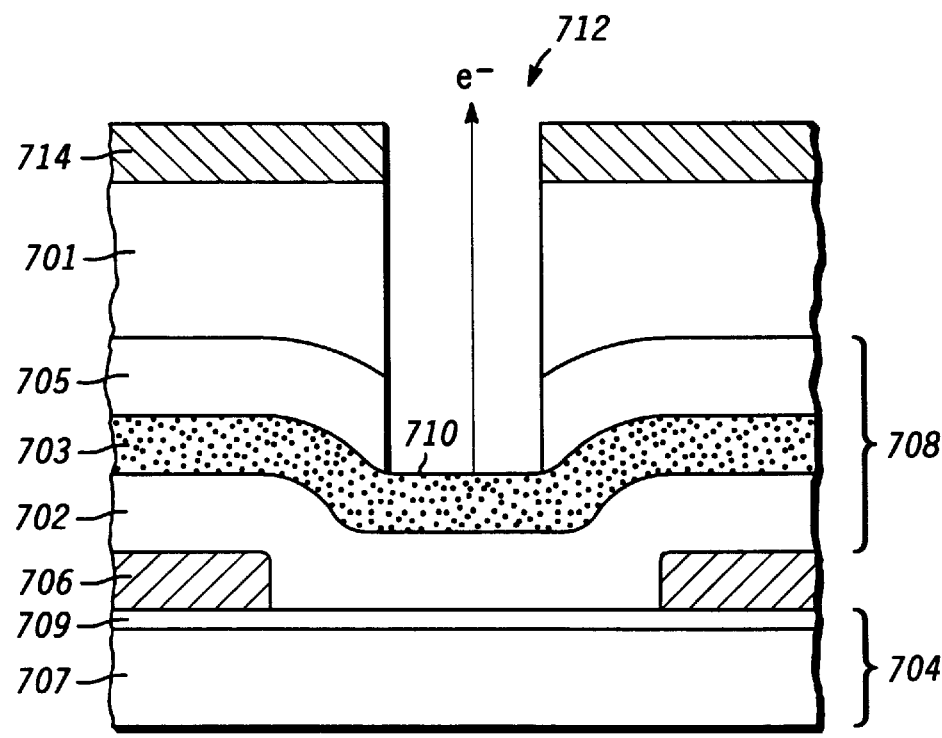
FIG. 11 is a cross-sectional view of a completed emission structure similar to the structure of FIG. 10.

Referring now to FIG. 11, there is depicted a cross-sectional view of a field emission device 710 formed from structure 700 of FIG. 10. A conductive column 711 is formed on non-conducting amorphous carbon layer 701. Also, an emitter well 712 is defined by providing an aperture through emission-control layer 705, non-conducting amorphous carbon layer 701, and conductive column 711, thereby providing an electron emission surface 710 from which electrons are emitted under appropriate electric field conditions. In this particular embodiment, electron emission surface 710 is emissive when exposed to an electric field having a field strength less than about 150 volts/micrometer. The electric field is provided by operably coupling conductive row 706 and conductive column 714 to voltage sources (not shown) providing predetermined voltages. The edge of emission-control layer 705 is non-emissive (it does not emit an electrical current greater than 1 picoamp) when exposed to an electric field having an electric field strength less than about 200 volts/micrometer. The resistivity of ballast resistor layer 702 is specified so that electron emission from electron emission surface 710 is uniform over electron emission surface 710. The resistivity of emission-control layer 705 is at least one order of magnitude greater than the resistivity of ballast resistor layer 702. Emission-control layer 705 is also grown so that it shapes the electric field to provide focusing or defocusing of the electrons and to prevent electron injection into non-conducting amorphous carbon layer 701. Thus, emission-control layer 705 serves the dual functions of shaping the electric field and providing ballasting resistance, while ballast resistor layer 702 serves the function of providing ballasting resistance.

Other applications of a method in accordance with the present invention are readily appreciated. Structures can be realized by embodiments of a method in accordance with the present invention which find use in optical devices, such as wave guides, in electrical devices, in hard coatings, in tribological applications, and to improve mechanical properties. For example, quantum size effects in a multi-layered carbon superlattice can enhance the optical and electrical properties of a device. Additionally, an amorphous multi-layered structure can be designed to provide stress reduction in thick structures or to precisely control stress distribution in a structure so that, for example, stress can be concentrated away from an active layer of a device. In summary, methods in accordance with the present invention provide much better control of layer thickness, layer composition, repetition, and transition layer sharpness.

What is claimed is:

1. A field emission device comprising:

a substrate;

a conductive row being disposed on the substrate;

a non-conducting amorphous carbon layer including a layer of hydrogen-free amorphous carbon being non-conductive and being disposed on the substrate/conductive row;

a ballasted emission structure;

a conductive column being formed on the ballasted emission structure; and an aperture being formed through the conductive column, the ballasted emission structure, and the non-conducting amorphous carbon layer thereby forming an emitter well and thereby exposing an emission edge of the ballasted emission structure being disposed within the emitter well and being emissive when exposed to an electric field having a field strength less than 150 volts/micrometer.

2. A field emission device as claimed in claim 1 wherein the ballasted emission structure includes:

a ballast resistor layer including a layer of hydrogen-free amorphous carbon being non-emissive when exposed to an electric field having a field strength less than 200 volts/micrometer and being disposed on the non-conducting amorphous carbon layer;

an electron emitter layer including a layer of hydrogen-free amorphous carbon being disposed on the ballast resistor layer; and an emission-control layer including a layer of hydrogen-free amorphous carbon being non-emissive when exposed to an electric field having a field strength less than 200 volts/micrometer and being disposed on the electron emitter layer.

3. A field emission device as claimed in claim 2 wherein the electron emitter layer includes a plurality of layers of hydrogen-free amorphous carbon having thicknesses within a range of 0–100 angstroms so that the electron emitter layer exhibits quantum size effects.

4. A field emission device comprising:

a substrate;

a conductive row being disposed on the substrate;

a ballasted emission structure being formed on the substrate/conductive row;

a non-conducting amorphous carbon layer including a layer of hydrogen-free amorphous carbon being non-conductive and being disposed on the ballasted emission structure;

a conductive column being formed on the non-conducting amorphous carbon layer; and an aperture being formed through the conductive column and the non-conducting amorphous carbon layer thereby forming an emitter well and thereby exposing an electron emission surface of the ballasted emission structure, the electron emission surface being disposed within the emitter well and being emissive when exposed to an electric field having a field strength less than 150 volts/micrometer.

5. A field emission device as claimed in claim 4 wherein the ballasted emission structure includes:

a ballast resistor layer including a layer of hydrogen-free amorphous carbon being disposed on the substrate/conductive row and having a resistivity providing uniform electron emission over the electron emission surface;

an electron emitter layer including a layer of hydrogen-free amorphous carbon being disposed on the ballast resistor layer;

an emission-control layer including a layer of hydrogen-free amorphous carbon being non-emissive when exposed to an electric field having a field strength less than 200 volts/micrometer and being disposed on the electron emitter layer wherein the aperture is further formed through the emission-control layer thereby exposing the electron emission surface of the electron emitter layer being emissive when exposed to an electric field having a field strength less than 150 volts/micrometer.

* * * * *